Figure 1:
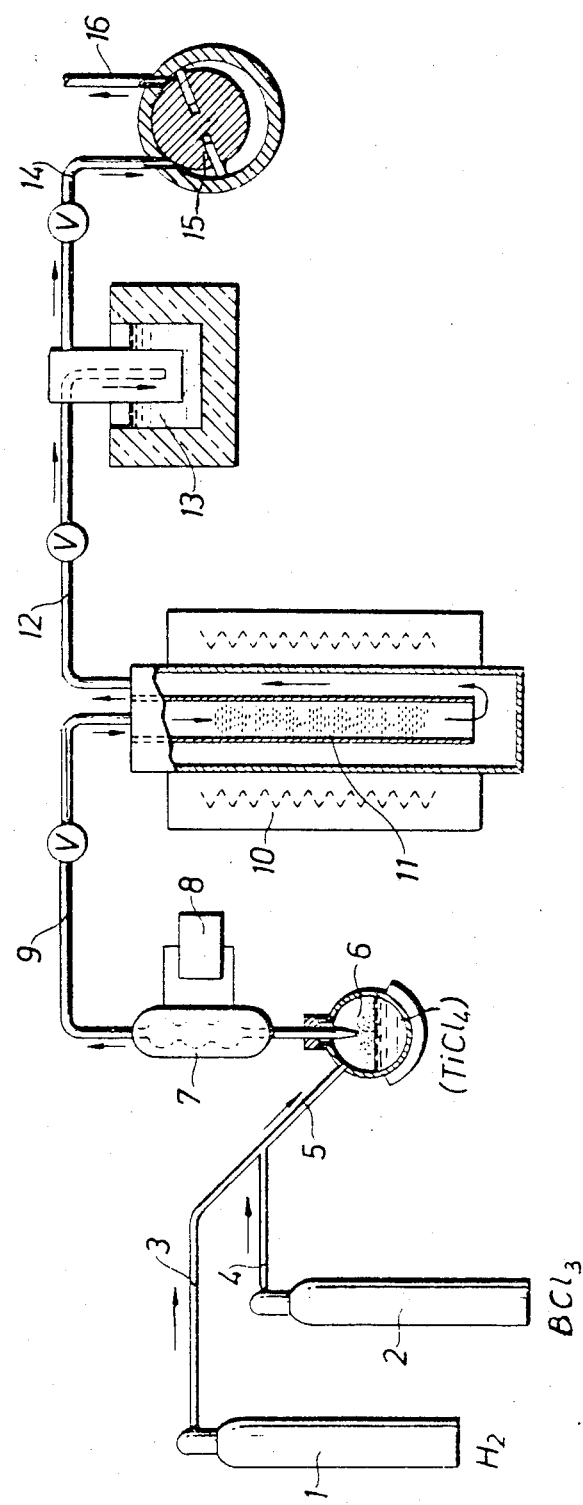

United States Patent [19]

Hillert et al.

[11] Patent Number: 4,629,661
[45] Date of Patent: Dec. 16, 1986

[54] CUTTING INSERT AND METHOD OF MAKING THE SAME

[75] Inventors: Lars H. Hillert, Nacka; Jan N. Lindström, Norsborg; Anders G. Thelin, Vällingby, all of Sweden

[73] Assignee: Santrade Limited, Lucerne, Switzerland

[21] Appl. No.: 736,772

[22] Filed: Jun. 18, 1985

Related U.S. Application Data

[63] Continuation of Ser. No. 531,736, Sep. 13, 1983, abandoned.

[30] Foreign Application Priority Data

Sep. 15, 1982 [SE] Sweden ............................. 8205274

[51] Int. Cl.$^4$ ........................... C09J 1/00; B22F 3/14; B22F 7/08
[52] U.S. Cl. .................................. 428/698; 428/701; 428/702
[58] Field of Search .............. 428/698, 699, 701, 702, 428/213-216

[56] References Cited

U.S. PATENT DOCUMENTS

| | | | |
|---|---|---|---|
| 3,955,038 | 5/1976 | Lindstrom et al. | 428/698 X |
| 4,321,100 | 3/1982 | Du Buske | 428/699 X |
| 4,403,015 | 9/1983 | Nakai et al. | 428/698 X |
| 4,441,894 | 4/1984 | Sarin et al. | 428/698 X |
| 4,447,283 | 5/1984 | Ebata et al. | 428/698 X |
| 4,522,633 | 6/1985 | Dyer | 428/698 X |
| 4,539,251 | 9/1985 | Sugisawa et al. | 428/698 X |

FOREIGN PATENT DOCUMENTS

| | | | |
|---|---|---|---|
| 062474 | 5/1978 | Japan | 428/699 |
| 061650 | 5/1979 | Japan | 428/698 |
| 0643166 | 5/1984 | Switzerland | 428/698 |

Primary Examiner—Nancy A. B. Swisher
Attorney, Agent, or Firm—Burns, Doane, Swecker & Mathis

[57] ABSTRACT

The wear resistance and toughness of a coated ceramic insert comprising a ceramic substrate and at least one thin surface layer of ceramic oxide is improved by applying at least one thin intermediate layer of hard borides of the subgroups or of the III-V groups of the periodic table, or of hard yttrium compounds. The layers are deposited from a gaseous phase.

13 Claims, 2 Drawing Figures

CUTTING INSERT AND METHOD OF MAKING THE SAME

This application is a continuation of application Ser. No. 531,736, filed Sept. 13, 1983 now abandoned.

The present invention relates to a cutting insert consisting essentially of ceramic oxides including sialon and, in particular, to a cutting insert having a thin, extremely fine grained surface coating. The invention also deals with a method of manufacturing said insert.

Sialon materials have good qualifications as tool materials due to good toughness and satisfactory resistance to temperature changes particularly in intermittent use. However, the use of sialon is limited because of the low wear resistance compared with ceramics and coated cemented carbide. Compared with coated cemented carbide grades, sialon also has a limited toughness. This appears as, among other things, an unfavourable wear of the edges, particularly in machining of steel.

In the U.S. Pat. No. 3,977,061 it is described how this problem is solved by applying a surface layer of ceramic materials, e.g., $Al_2O_3$, on substrates of ceramic materials (oxides mixed with one or more hard carbides, nitrides or the like, e.g., oxycarbides, oxynitrides, carbonitrides, or with binder metal) using CVD-techniques (Chemical Vapor Deposition).

However, it has been found that in applying ceramic coatings in this way on sialon there often are difficulties, particularly adherence difficulties, which have a tendency to increase with an increased thickness of the deposited ceramic layer.

In said patent the advantages of using intermediate layers of, among other compounds, TiN and TiC have been disclosed. In the case of sialon, TiN would be a good choice, as a good bonding to the sialon substrate, also containing nitrogen can be expected.

It has now quite surprisingly been found that layers of hard borides of the subgroups of the III-V groups of the periodic table can give at least as good improvements of the properties as those obtained with TiN, in particular in cutting of cast iron. The properties of ceramics of types different from sialon are also improved by boride layers. The same is obtained by intermediate layers of yttrium carbide and/or nitride or of hard silicide layers.

The intermediate layer according to the invention can be extremely thin, e.g. about 10 Å, but it can also be thicker, e.g., up to about 10 μm. The outer ceramic layer, which can also be a base for additional outer layers intended for giving advantages related to application as well as colour, has a thickness of 0.5-100 μm, preferably 1-8 μm.

Thus, with a first layer of boride, silicide or YC and/or YN it is possible to apply multiple layers, i.e., carbides, oxides, nitrides and borides in various layer sequences and with various thicknesses depending on the application.

For deposition of boride and silicide by CVD techniques besides usual metal halides, $BCl_3$ or other boron halides, vaporizable boranes etc., and $SiCl_4$, resp. can be used as vaporizable substances. For formation of layers of YN or YC one can use $YI_3$ or at higher temperatures other yttrium halides which then become vaporizable.

As a suitable range of temperature for the CVD process 700°-1300° C., preferably 900°-1200° C., can be chosen, whereby the resistance of the substrate and the layers to heat treatment has to be considered.

The coated inserts according to the invention can thus be manufactured according to methods known per se. The substrate is normally manufactured by pressing and sintering technique and the surface layer is applied by means of deposition from a gaseous phase.

Besides $Al_2O_3$, the ceramic layer can also consist of an oxide of Zr, Si, Ca, Mg, Ti, Y and/or Hf. Such layers can also be applied in combination or upon each other, depending upon different demands or possibilities.

Figure 2:
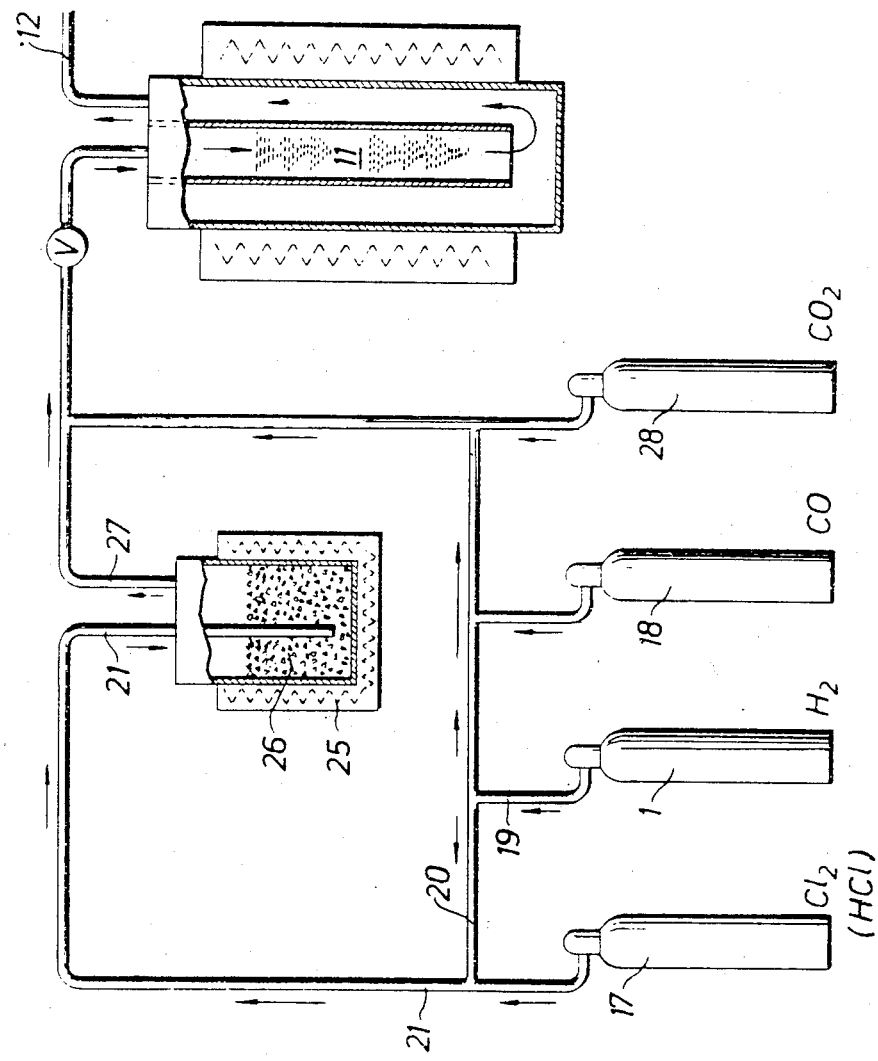

The method used in preparing ceramic cutting inserts according to the invention will now be described by illustrations in the following examples 1-4 and with reference to the attached drawings which show:

FIG. 1, principle sketch of an apparatus for depositing surface layers;

FIG. 2, principle sketch of an alternative detail in the apparatus according to FIG. 1.

The apparatus shown in FIG. 1 has gas sources, for example gas bottles 1, 2 for supply of hydrogen and boron trichloride, respectively. Through the conduit 3 hydrogen is led to a vessel 6 in which a metal halide (for example $TiCl_4$ or $YI_3$) is heated to vaporization, the resulting composite gas and $BCl_3$ being led to the reactor 11 by conduit 9 and 4, respectively. The gas mixture passes a heat exchanger 7 controlled by a thermostat 8 for setting the content of $TiCl_4$ in the gas. In the reactor 11, the substrate is placed for coating. From the reactor vessel 11 the gas is sucked out, passing a valve-equipped conduit 12 and a cool trap 13. The evacuation of gas from the system is done in a conduit 14 by means of a vacuum pump 15 having an outlet 16. (In the drawings, purification means for gas have been omitted.)

The apparatus sketched in FIG. 2 illustrates the use of a chlorinating reactor 25 for chlorination of Al, for example, in the form of grains 26. For this purpose hydrogen from a gas source 1 is mixed by conduits 19, 20 with chlorine alternatively hydrochlorine from a source 17 and a mixture is led to the chlorinating reactor through a conduit 21.

The gas mixture from the chlorinating reactor 25 is then mixed with hydrogen and optionally carbon monoxide and carbon dioxide from the gas source 18 respectively 28. The resulting mixture is then led to the coating reactor 11 by the valve-equipped conduit 27.

In the case of $YI_3$ (or $YCl_3$) conduits leading to the reactor have to be heated to prevent deposits of $YI_3$ ($YCl_3$). It may be necessary to omit the valves in such conduits and to choose material for conduits and other details which can endure the high temperatures to be used. $BCl_3$ and boranes may be added from gas bottles in a usual manner.

In the following Examples 1-4 there are given those conditions under which ceramic inserts according to the invention are prepared. In the Examples 5-7 there are results which are obtained in cutting tests.

EXAMPLE 1

Conventional cutting inserts of sialon with 5% $Al_2O_3$, by weight, and 6% $Y_2O_3$ are coated with a 2 μm thick intermediate layer of TiN. The deposition gas—consisting of a mixture of 5% $TiCl_4$ (by volume), 30% $N_2$ and 65% $H_2$—is prepared in known ways. The pressure in the reactor is maintained at 15 torr and a linear gas flow rate of 1 m/sec is maintained in the charge. Said treatment is continued at a temperature of 1050° C. for 3 h resulting in fine-grained, compact layers of TiN with a thickness of about 2 μm.

In a separate second step, the inserts are treated in a gas having the composition 82% $H_2$, 5% $CO_2$, 8% CO and 5% $AlCl_3$. The substrate temperature is 1100° C. and the pressure 15 torr. A linear gas flow rate of 3.5 m/s is used. After a coating time of 3 h, 2 μm thick layers of $Al_2O_3$ are obtained upon the TiN-coated inserts.

Other sialon inserts are coated with a 4 μm thick $Al_2O_3$ layer, solely, and some sialon inserts are coated with a 2 μm $Al_2O_3$ layer, solely.

The obtained inserts are thus representing the technique of the prior art.

EXAMPLE 2

Sialon inserts of the same type as in Example 1 are first coated with 2 μm $TiB_2$ at the following process conditions:

| Gas composition: | Linear gas flow rate: 0.5 m/s |
|---|---|
| $BCl_3$ 4% | Pressure: 6.7 kPa |
| $TiCl_4$ 8% | Temperature: 1030° C. |
| $H_2$ balance | Time: 3 h |

Coating with 2 μm $Al_2O_3$ is then performed in the same way as in Example 1.

EXAMPLE 3

Coating of the same type of sialon substrate as in Example 1 is performed as in Example 2 but instead of $TiB_2$, YN is obtained by using a gas mixture of $YI_3$ 1%, $N_2$ 40%, $H_2$ balance.

The temperature is 1080° C., and 2 μm YN+2 m $Al_2O_3$ layers are obtained. Coating of additional sialon substrates is principally performed as in Example 3 in the U.S. Pat. No. 3,977,061. However, the coating process is started with deposition of 1 μm YN according to the above (the deposition time is accordingly reduced by 50%), whereafter 1 μm TiC is deposited according to Example 3 in U.S. Pat. No 3,977,061, i.e., with the following process parameters:

Gas composition: 10% $TiCl_4$, 8% $CH_4$, 82% $H_2$.
Pressure: 15 torr
Temperature: 1000° C.
Linear gas flow rate: 1 m/s
Time: about 15 min.

EXAMPLE 4

Ceramic inserts consisting of $Al_2O_3$ with an addition of MgO are coated with
(a) 2 μm $Al_2O_3$ according to Ex. 2 in U.S. Pat. No. 3,977,061, i.e. with the following parameters:
  Gas composition: 5% $CO_2$, 4% CO, 5% $AlCl_3$, 86% $H_2$
  Temperature: 1100° C.
  Pressure: 15 torr
  Linear gas flow rate: 3.5 m/s
  Time: 3 h
(b) TiN+$Al_2O_3$ (2+2 μm) according to Example 1 above;
(c) $ZrB_2$+$Al_2O_3$ (2+2 μm) as in Example 2, but in order to obtain $ZrB_2$, 10% $ZrCl_4$ is used instead of $TiCl_4$.

EXAMPLE 5

Continues cutting in cast iron (SIS(Swedish standard) 0125) is performed, using the following conditions:

| Work piece: | SIS 0125 |
|---|---|
| Cutting speed: | 300 m/min |
| Feed rate: | 0,30 mm/rev |
| Cutting depth: | 2,0 mm |
| Insert style: | SN GN 120416 |
| Primary land: | 0,20 mm × 20° |

The following results as regards the life of the insert are obtained for the different insert variants used in the test.

| Variant | Life Flank wear ($V_B$ = 0,40 mm) |
|---|---|
| 1. Homogeneous sialon | 3,3 min |
| 2. $Al_2O_3$ (2 μm) on sialon (Ex. 1) | 7,0 min |
| 3. $Al_2O_3$ (4 μm) on sialon (Ex. 1) | 10,0 min |
| 4. TiN + $Al_2O_3$ (2 + 2 μm) on sialon (Ex. 1) | 10,5 min |
| 5. $TiB_2$ + $Al_2O_3$ (2 + 2 μm) on sialon (Ex. 2, acc. to the invent.) | 12,0 min |
| 6. YN + $Al_2O_3$ (2 + 2 μm) on sialon (Ex. 3, acc. to the invent.) | 12,2 min |
| 7. YN + TiC + $Al_2O_3$ (1 + 1 + 2 μm) (Ex. 3, acc. to the invent.) on sialon | 13,3 min |

EXAMPLE 6

Another cutting test is performed as intermittent cutting in cast iron, using different insert variants and the following conditions:

| Work piece: | SIS 0125 |
|---|---|
| Cutting speed: | 600 m/min |
| Feed rate: | 0,20 mm/rev |
| Cutting depth: | 1,0 mm |
| Insert style: | SNGN 120416 |
| Primary land: | 0,20 mm × 20° |

The following lives of the inserts are obtained:

| Variant | Life ($V_B$ = 0,40 mm) |
|---|---|
| 1. cf. Ex. 5 | 3,7 min |
| 2. cf. of Ex. 5 | 5,5 min |
| 3. cf. of Ex. 5 | flaking |
| 4. cf. of Ex. 5 | 6,7 min |
| 5. cf. of Ex. 5 (acc. to the invention) | 7,3 min |
| 6. cf. of Ex. 5 | 7,8 min |

EXAMPLE 7

Cutting tests are performed with inserts according to the following conditions:
Turning of a brake drum (roughing of a flange) Material: Steel with a hardness of HB 180
Tool: Insert holder "T-max"
Insert type: "SNGN 120812"
Cutting data:

| Cutting speed: | 300 m/min |
|---|---|
| Feed: | 0,5 mm/rev |
| Cutting depth: | 3 mm |

Results:

| Variant | Life |
|---|---|
| Uncoated ceramics (no sialon) | 61 min |
| Ceramics (no sialon) coated with 2 μm $Al_2O_3$ according to Ex. 4a) | 117 min |
| Ceramics (no sialon) coated with TiN + | 140 min |

-continued

| | | |
|---|---|---|
| Cutting speed: | 300 m/min | |
| Feed: | 0,5 mm/rev | |
| Cutting depth: | 3 mm | |
| Results: | | |
| Variant | | Life |
| Al$_2$O$_3$ (2 + 2 μm) according to Ex. 4b) Ceramics (no sialon) coated with ZrB$_2$ + Al$_2$O$_3$ (2 + 2 μm) according to Ex. 4c) | | 149 min |

What is claimed is:

1. A cutting insert comprising:
   (a) a ceramic substrate comprised of a material selected from the group consisting of:
      (i) ceramic oxide and
      (ii) ceramic oxide mixed with at least one member selected from the group consisting of hard carbides, nitrides and binder metal;
   (b) at least one thin intermediate layer covering the substrate and comprised of at least one member selected from the group consisting of at least one hard boride of the subgroups of the III–V groups of the periodic table and hard yttrium compounds; and
   (c) at least one thin surface layer of ceramic oxide wherein said layers are deposited from a gaseous phase and have a mean grain size smaller than that of the substrate.

2. Cutting insert according to claim 1, characterized in that the intermediate layer is about 10A–10 μm thick.

3. Cutting insert according to claim 2 or 1, characterized in that the thickness of the surface layer is 0.5–100 μm preferably 1–8 μm.

4. Cutting insert according to claim 3, characterized in that the surface layer comprises at least one oxide of Al, Zr, Si, Ca, Mg, Ti, Hf and Y.

5. Cutting insert according to claim 3, characterized in that the yttrium compounds comprise at least one of carbides and nitrides.

6. Cutting insert according to claim 3, characterized in that the substrate consists of sialon.

7. Cutting insert according to claim 2 or 1, characterized in that the surface layer comprises at least one oxide of Al, Zr, Si, Ca, Mg, Ti, Hf and Y.

8. Cutting insert according to claim 7, characterized in that the yttrium compounds comprise at least one of carbides and nitrides.

9. Cutting insert according to claim 7, characterized in that the substrate consists of sialon.

10. Cutting insert according to claim 2 or 1, characterized in that the yttrium compounds comprise at least one of carbides and nitrides.

11. Cutting insert according to claim 10, characterized in that the substrate consists of sialon.

12. Cutting insert according to claim 2 or 1, characterized in that the substrate consists of sialon.

13. A cutting insert comprising:
   (a) a ceramic sialon substrate;
   (b) at least one thin intermediate layer covering the ceramic sialon substrate and comprised of at least one member selected from the group consisting of at least one hard boride of the subgroups of the III–V groups of the periodic table and hard yttrium compounds; and
   (c) at least one thin surface layer of ceramic oxide wherein said layers are deposited from a gaseous phase and have a mean grain size smaller than that of the ceramic sialon substrate.

* * * * *